US011916328B2

(12) United States Patent
Hashimoto et al.

(10) Patent No.: US 11,916,328 B2
(45) Date of Patent: Feb. 27, 2024

(54) SOCKET HAVING SOLDER BALLS

(71) Applicant: Tyco Electronics Japan G.K., Kawasaki (JP)

(72) Inventors: Naoki Hashimoto, Kawasaki (JP); Shinichi Hashimoto, Kawasaki (JP)

(73) Assignee: Tyco Electronics Japan G. K., Kawasaki (JP)

( * ) Notice: Subject to any disclaimer, the term of this patent is extended or adjusted under 35 U.S.C. 154(b) by 234 days.

(21) Appl. No.: 17/084,120

(22) Filed: Oct. 29, 2020

(65) Prior Publication Data

US 2021/0126394 A1    Apr. 29, 2021

(30) Foreign Application Priority Data

Oct. 29, 2019    (JP) .................................. 2019-196587

(51) Int. Cl.
*H05K 7/10*    (2006.01)
*H01R 12/71*    (2011.01)
(Continued)

(52) U.S. Cl.
CPC ........... *H01R 13/11* (2013.01); *H01R 12/716* (2013.01); *H01R 13/2442* (2013.01);
(Continued)

(58) Field of Classification Search
CPC .. H01R 13/11; H01R 12/716; H01R 13/2442; H01R 13/40; H01R 13/02; H05K 3/301;
(Continued)

(56) References Cited

U.S. PATENT DOCUMENTS 5,518,410 A * 5/1996 Masami ............. H01R 13/2485
439/700
6,210,176 B1 * 4/2001 Hsiao ................... H05K 7/1069
439/71
(Continued)

FOREIGN PATENT DOCUMENTS

| CN | 103367302 A | 10/2013 |
| CN | 108695606 A | 10/2018 |
| JP | 2012-28408 A | 2/2012 |

OTHER PUBLICATIONS

Chinese First Office Action dated Oct. 31, 2023 with English translation, corresponding to Application No. 202011163513.6, 6 pages.

*Primary Examiner* — Abdullah A Riyami
*Assistant Examiner* — Nelson R. Burgos-Guntin
(74) *Attorney, Agent, or Firm* — Barley Snyder

(57) ABSTRACT

A socket includes a flat-plate-shaped housing, a plurality of contacts supported by the flat-plate-shaped housing, a frame attached to the flat-plate-shaped housing and extending along the flat-plate-shaped housing, a plurality of first solder balls disposed on a lower surface of the flat-plate-shaped housing and facing a circuit board, and a plurality of second solder balls disposed on the lower surface of the flat-plate-shaped housing. The frame defines, in an in-plane direction of the flat-plate-shaped housing, a position of an electronic component having a lower surface including a plurality of pads configured to contact the contacts upon the electronic component being mounted. The first solder balls electrically connect to each of the contacts and electrically connect to the circuit board. The second solder balls are not electrically connected to the contacts.

23 Claims, 4 Drawing Sheets

(51) Int. Cl.
 *H01R 13/11* (2006.01)
 *H01R 13/24* (2006.01)
 *H01R 13/40* (2006.01)
 *H05K 3/30* (2006.01)
 *H05K 3/34* (2006.01)

(52) U.S. Cl.
 CPC ............. *H01R 13/40* (2013.01); *H05K 3/301* (2013.01); *H05K 3/3457* (2013.01); *H05K 7/1069* (2013.01)

(58) Field of Classification Search
 CPC .. H05K 3/3457; H05K 7/1069; H05K 3/3436; H05K 2201/10325
 See application file for complete search history.

(56) References Cited

U.S. PATENT DOCUMENTS

| | | | | |
|---|---|---|---|---|
| 6,246,247 | B1 * | 6/2001 | Eldridge | H01L 24/81 |
| | | | | 257/E21.507 |
| 6,257,904 | B1 * | 7/2001 | Lin | H05K 1/141 |
| | | | | 439/71 |
| 6,394,819 | B1 * | 5/2002 | Mosser, III | H05K 7/1061 |
| | | | | 439/83 |
| 6,469,530 | B1 * | 10/2002 | Johnson | H05K 1/0268 |
| | | | | 324/750.25 |
| 7,658,617 | B1 * | 2/2010 | Brodsky | H05K 7/1069 |
| | | | | 439/83 |
| 10,461,447 | B2 | 10/2019 | Taguchi | |
| 10,856,432 | B1 * | 12/2020 | Blackburn | H01R 13/24 |
| 10,939,560 | B1 * | 3/2021 | Hornung | H05K 1/141 |
| 11,337,327 | B2 * | 5/2022 | Rengarajan | H01L 23/49816 |
| 2002/0160632 | A1 * | 10/2002 | Maldonado | H01R 12/52 |
| | | | | 439/66 |
| 2005/0068752 | A1 * | 3/2005 | Hashimoto | H05K 7/1069 |
| | | | | 174/262 |
| 2007/0004261 | A1 * | 1/2007 | Hayakawa | H05K 7/1069 |
| | | | | 439/331 |
| 2009/0042412 | A1 * | 2/2009 | Hashimoto | H05K 7/1069 |
| | | | | 439/73 |
| 2009/0280690 | A1 * | 11/2009 | Taguchi | H01R 13/2442 |
| | | | | 439/626 |
| 2009/0286417 | A1 * | 11/2009 | Taguchi | H05K 7/1007 |
| | | | | 439/331 |
| 2010/0015823 | A1 * | 1/2010 | Kojima | H05K 7/1069 |
| | | | | 439/84 |
| 2013/0004120 | A1 * | 1/2013 | Zbinden | G02B 6/4293 |
| | | | | 385/14 |
| 2013/0264708 | A1 | 10/2013 | Hiwatashi | |
| 2014/0045350 | A1 * | 2/2014 | Taylor | H01R 13/24 |
| | | | | 29/846 |
| 2014/0127922 | A1 * | 5/2014 | Sasaki | H01R 13/187 |
| | | | | 439/259 |
| 2014/0370725 | A1 * | 12/2014 | Palaniappa | H05K 7/10 |
| | | | | 439/81 |
| 2016/0181714 | A1 * | 6/2016 | Chawla | H01R 43/205 |
| | | | | 29/842 |
| 2016/0240952 | A1 * | 8/2016 | Suzuki | H05K 7/1069 |
| 2017/0054264 | A1 * | 2/2017 | Ryu | H01R 43/205 |
| 2017/0194721 | A1 * | 7/2017 | Fan | H01R 12/57 |
| 2018/0287276 | A1 * | 10/2018 | Taguchi | H01R 12/716 |
| 2018/0287279 | A1 * | 10/2018 | Taguchi | H05K 7/1038 |
| 2018/0343739 | A1 * | 11/2018 | Lai | H05K 1/0243 |
| 2019/0115292 | A1 * | 4/2019 | Morrison | H01L 23/49827 |
| 2019/0148858 | A1 * | 5/2019 | Mason | H01R 13/111 |
| | | | | 439/67 |
| 2019/0150311 | A1 * | 5/2019 | Mason | H05K 3/3436 |
| | | | | 439/55 |
| 2019/0387638 | A1 * | 12/2019 | Rengarajan | H01R 13/6471 |
| 2020/0153140 | A1 * | 5/2020 | Hashimoto | H01R 13/2464 |
| 2020/0295483 | A1 * | 9/2020 | Costello | H05K 1/117 |
| 2021/0021067 | A1 * | 1/2021 | Hsu | H01R 13/2478 |
| 2021/0126394 | A1 * | 4/2021 | Hashimoto | H05K 7/1069 |
| 2021/0257765 | A1 * | 8/2021 | Yamada | H01R 13/03 |
| 2021/0345506 | A1 * | 11/2021 | Tsuji | H01R 12/7047 |

\* cited by examiner

SOCKET HAVING SOLDER BALLS

CROSS-REFERENCE TO RELATED APPLICATION

This application claims the benefit of the filing date under 35 U.S.C. § 119(a)-(d) of Japanese Patent Application No. 2019-196587, filed on Oct. 29, 2019.

FIELD OF THE INVENTION

The present disclosure relates to a socket and, more particularly, to a socket having a plurality of solder balls.

BACKGROUND

When mounted on a circuit board, a large-scale electronic component is often mounted on the circuit board via a socket rather than directly soldered to the circuit board. In other words, the socket is often soldered to the circuit board, and the electronic component is often attached to the socket. A large number of contacts which come into contact with respective contact pads arrayed on the bottom surface of the electronic component are arrayed on the socket to protrude from a first surface of a flat-plate-shaped housing. Moreover, a large number of solder balls corresponding to a large number of the contacts on the first surface, respectively, are positioned on a second surface of the housing. Japanese Patent Application No. 2012-28408A, for example, discloses a socket including a flat-plate-shaped support, a large number of contacts, and a large number of solder balls (bumps).

Conventionally, a liquid crystal polymer (LCP) resin has often been used in the housing of such a socket. The thermal expansion coefficient of the LCP resin, however, is different from that of a circuit board. In recent years, electronic components such as large-scale CPUs have started to appear, which include a bottom surface having an many as 5000 contact pads that are arrayed two-dimensionally, for example, at a pitch of 1 mm. When the housing of a socket for such an electronic component is made of an LCP resin, there is a risk that a soldered portion may crack due to the difference between the thermal expansion coefficients of the LCP resin and the circuit board, or that the socket may warp in when a socket that is soldered to a circuit board returns to ambient temperature.

Thus, in recent years, flat-plate-shaped housings that are made of a same material as the circuit board are being used as socket housings. By using a housing made of the same material as the circuit board, one can configure a socket for a large-scale electronic component in which a problem caused by the difference between thermal expansion coefficients may be suppressed.

Nevertheless, even if the materials of the housing and the circuit board are said to be equivalent to one another, such materials are not perfectly identical, and there can a slight difference between the thermal expansion coefficients of the materials. In a multipolar socket with as many as 5000 pins, any such difference cannot be ignored, and solder joint portions at four corners are particularly prone to stress after reflow soldering until the temperature returns to normal. Moreover, when an electronic component with a large number of contact pads is mounted, the solder joint portions are subjected to stress due to vertical load.

To solve the problem of the stress caused by the vertical load, one may position spacers at a plurality of places on the surface of a flat-plate-shaped housing facing a circuit board. A constant spacing can be achieved, regardless of the positions on the flat-plate-shaped housing, by placing the spacers and allowing them to abut on the circuit board. As a result, the stress on the solder joint portion, caused by the vertical load, may be suppressed. Positioning the spacers, however, results in an increased number of components, i.e., the spacers, which leads to increased assembly times and higher cost.

SUMMARY

A socket includes a flat-plate-shaped housing, a plurality of contacts supported by the flat-plate-shaped housing, a frame attached to the flat-plate-shaped housing and extending along the flat-plate-shaped housing, a plurality of first solder balls disposed on a lower surface of the flat-plate-shaped housing and facing a circuit board, and a plurality of second solder balls disposed on the lower surface of the flat-plate-shaped housing. The frame defines, in an in-plane direction of the flat-plate-shaped housing, a position of an electronic component having a lower surface including a plurality of pads configured to contact the contacts upon the electronic component being mounted. The first solder balls electrically connect to each of the contacts and electrically connect to the circuit board. The second solder balls are not electrically connected to the contacts.

BRIEF DESCRIPTION OF THE DRAWINGS

The invention will now be described by way of example with reference to the accompanying Figures, of which.

DETAILED DESCRIPTION OF THE EMBODIMENT(S)

Figure 1:
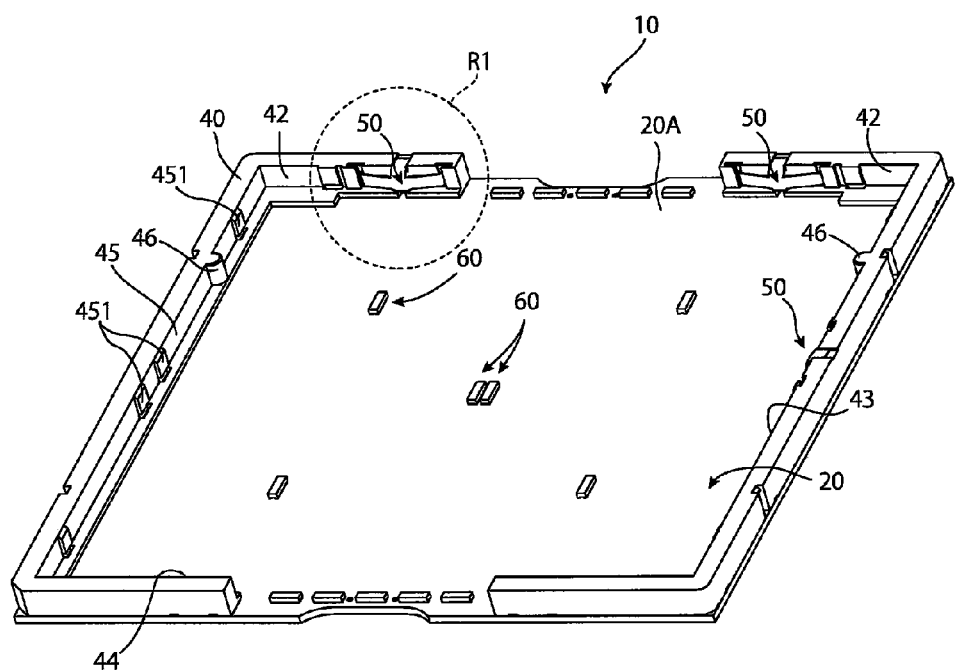
FIG. 1 is a perspective view of a first surface of a socket according to an embodiment.

Exemplary embodiments of the present disclosure will be described hereinafter in detail with reference to the attached drawings, wherein like reference numerals refer to like elements. The present disclosure may, however, be embodied in many different forms and should not be construed as being limited to the embodiments set forth herein; rather, these embodiments are provided so that the present disclosure will convey the concept of the disclosure to those skilled in the art. Furthermore, several aspects of the embodiments may form—individually or in different combinations—solutions according to the present invention. The following described embodiments thus can be considered either alone or in an arbitrary combination thereof.

A socket 10 according to an embodiment, as shown in FIG. 1, includes a flat-plate-shaped housing 20, a large number of contacts 30, for example, as many as five thousand contacts (see FIG. 2), and two frames 40 each having a lateral square-U-shape. In FIG. 1, an illustration of the contacts 30 is omitted for clarity of the drawing. Moreover, the socket 10 includes spring elements 50 and sitting elements 60. Each component of the socket 10 will be described in turn below.

FIGS. 2A-2E each illustrate a part of the flat-plate-shaped housing 20 of the socket 10 in FIG. 1.

Figure 2A:
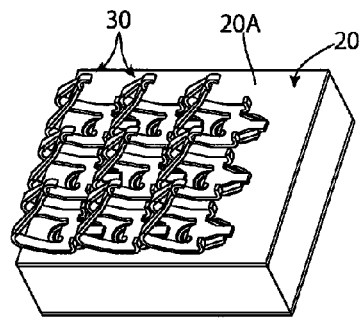
FIG. 2A is a perspective view of a portion of a flat-plate-shaped housing of the socket.
Figure 2B:
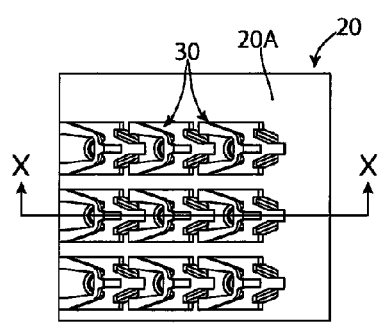
FIG. 2B is a top view of the portion of the flat-plate-shaped housing.
Figure 2E:
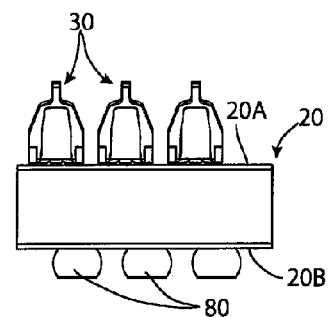
FIG. 2E is another side view of the portion of the flat-plate-shaped housing.
Figure 2C:
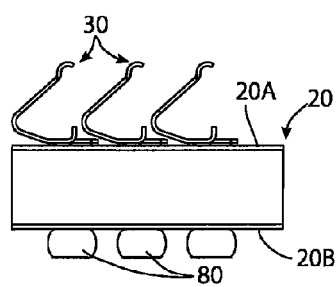
FIG. 2C is a side view of the portion of the flat-plate-shaped housing.
Figure 2D:
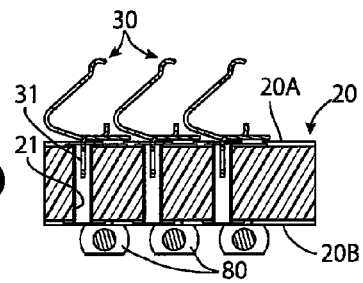
FIG. 2D is a sectional side view of the portion of the flat-plate-shaped housing.

A plurality of through-holes 21, as illustrated in FIG. 2D, are formed in the flat-plate-shaped housing 20. The inner wall surfaces of the through holes 21 are conductive layers formed by plating of a conductive metal.

A large number of the contacts 30 are arrayed on the flat-plate-shaped housing 20 to protrude from a first surface 20A of the flat-plate-shaped housing 20, as shown in FIGS. 2A-2E. The contacts 30 are electrically connected to the conductive layers of the inner wall surfaces of the through-holes 21 by inserting a press-fit portion 31 of each of the contacts 30 into one of the through-holes 21, as illustrated in FIG. 2D. The contacts 30 come into contact with, and they are electrically connected to, contact pads arrayed on a bottom surface of an electronic component mounted to face the first surface (upper surface) 20A of the flat-plate-shaped housing 20.

As shown in FIGS. 2C-2E, a plurality of solder balls 80 corresponding to the contacts 30, respectively, are arrayed on a second surface 20B of the flat-plate-shaped housing 20. The solder balls 80 are electrically connected to the conductive layers of the inner wall surfaces of the corresponding through-holes 21. As a result, the contacts 30 and the solder balls 80 are electrically connected to each other, respectively, through the conductive layers in the respective through-holes 21. The socket 10 is mounted on a circuit board and electrically connected to the circuit board by soldering with the solder balls 80.

Figure 3:
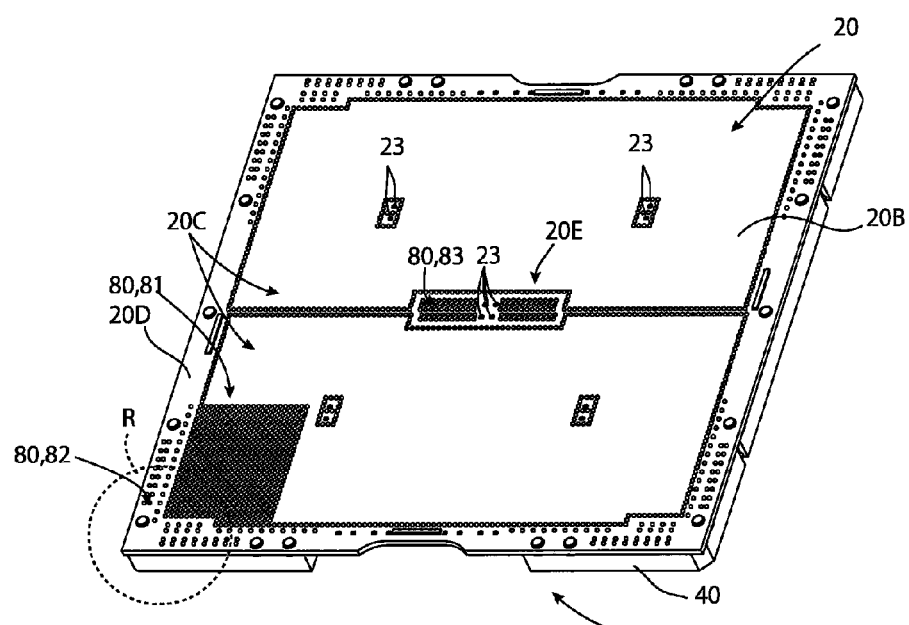
FIG. 3 is a perspective view of a second surface of the socket.
Figure 4:
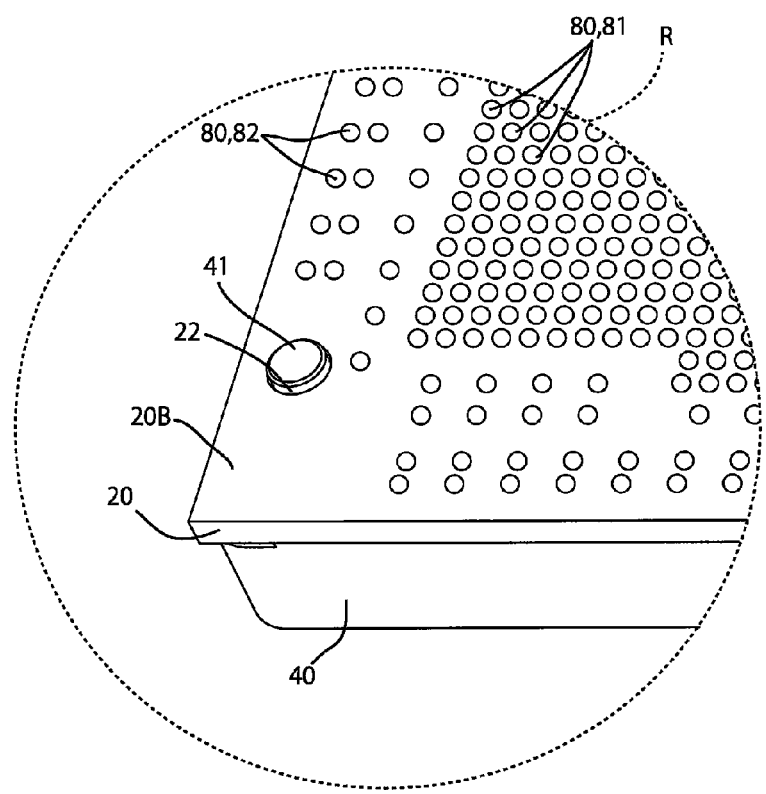
FIG. 4 is a detail view of a circle R of FIG. 3.

In the flat-plate-shaped housing 20, each of a plurality of locating holes 22, as shown in FIGS. 3 and 4, is formed at a position along each of the edges of the flat-plate-shaped housing 20. In the lower surface in each frame 40, bosses 41, shown in FIG. 4, for positioning are disposed at positions corresponding to the positioning holes 22, respectively. The frames 40 are positioned and fixed on the flat-plate-shaped housing 20 by press-fitting the bosses 41 into the positioning holes 22.

As illustrated in FIG. 1, the frames 40 are erected on the flat-plate-shaped housing 20, and extend along the edges of the flat-plate-shaped housing 20. The frames 40 guide the side surfaces of an electronic component in the case of mounting the electronic component, and they position the electronic component in an in-plane direction of the flat-plate-shaped housing 20. However, the positioning by the frames 40 alone is not sufficient for the positioning accuracy, and in the socket 10, the positioning accuracy is enhanced as described below.

The socket 10 includes three spring elements 50 made of elastic metal, as shown in FIG. 1. Among them, two spring elements 50 are supported by first sides 42 of the frames 40. Moreover, the remaining one spring element 50 is supported by a second side 43 that does not face the first sides 42 of the frames 40. The spring elements 50 have a role in pushing a mounted electronic component to sides (reference sides) 44 and 45 of the frames 40 that face the sides 42, 43 that support the spring elements 50. In other words, the spring elements 50 supported by the first side 42 push the electronic component to the third side 44 that faces the first side 42. Moreover, the spring element 50 supported by the second side 43 pushes the electronic component to the fourth side 45 that faces the second side 43.

As shown in FIG. 1, a plurality of receiving portions 451, which inwardly bulge, and to which the electronic component pressed by the spring element 50 supported by the second side 43 is pushed, are formed in the fourth side 45. Although not illustrated, receiving portions, which are inwardly bulged, and to which the electronic component pressed by the spring elements 50 supported by the first sides 42 is pushed, are also similarly formed in the third side 44. On the side 43, a semi-cylindrical-shaped key element that determines a method of mounting an electronic component is disposed in correspondence with a notch of the electronic component.

The sitting elements 60, as shown in FIG. 1, are elements that regulate a spacing between the first surface 20A of the flat-plate-shaped housing 20 and the bottom face of the mounted electronic component to be constant regardless of place on the flat-plate-shaped housing 20. In the case of a socket 10 on which a large-scale electronic component including a very large number of contact pads is mounted, the flat-plate-shaped housing 20 included in the socket 10 is also a housing 20 having a large area. Therefore, even slight warpage may cause the heights of the first surface 20A (see FIG. 2) to be non-negligibly different between the central section of the flat-plate-shaped housing 20 and a section closer to the edge of flat-plate-shaped housing 20 due to the large area. In other words, this means that contact pressures between the contacts 30 and the contact pads on the bottom surface of the mounted electronic component are non-negligibly different. Thus, the socket 10 includes the sitting elements 60 so that the contact pressures are constant regardless of position on the flat-plate-shaped housing 20. The sitting elements 60 include press-fit portions, and they are fixed to the flat-plate-shaped housing 20 by press-fitting the press-fit portions into a plurality of insertion holes 23 formed in the flat-plate-shaped housing 20, shown in FIG. 3.

A large number of the solder balls 80 are illustrated in FIG. 3. The solder balls 80 are positioned on the whole area of a central portion 20C, excluding an edge 20D on the periphery of the second surface (lower surface) 20B of the flat-plate-shaped housing 20, and the peripheries of the insertion holes 23 into which the press-fit portions of the sitting elements 60 (see FIG. 1) are press-fitted. Herein, only some of the solder balls 80 are illustrated for clarity of the drawing.

The solder balls 80 positioned in the central portion 20C, as shown in FIG. 3, are solder balls 81 having a role in electrical connection between the electronic component and the circuit board via the contacts 30. Moreover, the solder balls 80 are also formed in the edge 20D of the second surface 20B of the flat-plate-shaped housing 20 and in the vicinity 20E of the center of the second surface 20B. Solder balls 82 formed in the edge 20D and solder balls 83 formed in the vicinity 20E of the center are solder balls 80 that are not involved in electrical connection but are subjected to vertical load and the fixation of the flat-plate-shaped housing 20 to the circuit board. Herein, the solder balls 81 positioned in the central portion 20C and the solder balls 83 formed in the vicinity 20E of the center correspond to examples of the first solder balls 81, 83 according to the present disclosure. Moreover, the solder balls 82 positioned in the edge 20D correspond to an example of the second solder balls 82 according to the present disclosure.

The solder balls 82 of the edge 20D as well as the solder balls 81 positioned in the central portion 20C have a role in fixing the flat-plate-shaped housing 20 to the circuit board. Moreover, the solder balls 83 positioned in the vicinity 20E of the center of the second surface 20B have a role in fixing the flat-plate-shaped housing 20 to the circuit board, and is subjected to vertical load from the electronic component. Due to the second solder balls 82, soldering strength as a whole is increased to reduce stress on the first solder balls 81, 83, and defective solder jointing may be prevented.

The first solder balls 81, 83 are densely positioned in the central portion 20C of the flat-plate-shaped housing 20. However, at a position closer to the edge 20D of the flat-plate-shaped housing 20, a region in which the first solder balls 81, 83 are not densely positioned is present, e.g., a boundary between a region in which the first solder balls 81, 83 are positioned and a region in which the first solder balls 81, 83 are not positioned. Thus, stress on a solder joint portion is further effectively suppressed by positioning the second solder balls 82 in the region closer to the edge 20D. Stress on a solder joint portion can therefore be suppressed without the addition of additional components such as spacers.

What is claimed is:

1. A socket, comprising:
a flat-plate-shaped housing;
a plurality of contacts supported by the flat-plate-shaped housing;
a frame attached to the flat-plate-shaped housing and extending along the flat-plate- shaped housing, the frame defining, in an in-plane direction of the flat-plate-shaped housing, a position of an electronic component having a lower surface including a plurality of pads configured to contact the contacts upon the electronic component being mounted;
a plurality of first solder balls disposed on a lower surface of the flat-plate-shaped housing and facing a circuit board, the first solder balls electrically connect to each of the contacts and electrically connect to the circuit board; and
a plurality of second solder balls disposed on the lower surface of the flat-plate-shaped housing and aligned with the frame, the second solder balls are not electrically connected to the contacts.

2. The socket of claim 1, wherein the second solder balls are positioned closer to an edge of the flat-plate-shaped housing than the first solder balls.

3. A socket, comprising:
a flat-plate-shaped housing;
a plurality of contacts supported by the flat-plate-shaped housing;
a plurality of first solder balls disposed on a lower surface of the flat-plate-shaped housing and electrically connected to the contacts;
a plurality of second solder balls disposed on the lower surface and not electrically connected to the contacts; and
a frame attached to the flat-plate-shaped housing and extending along the flat-plate- shaped housing, the second solder balls are positioned on the lower surface of the flat-plate- shaped housing and are aligned with the frame.

4. The socket of claim 3, wherein the first solder balls and the second solder balls connect the socket to a circuit board.

5. The socket of claim 4, wherein the first solder balls electrically connect the contacts to the circuit board.

6. The socket of claim 5, wherein the second solder balls only mechanically fix the flat-plate-shaped housing to the circuit board.

7. The socket of claim 3, wherein the second solder balls are positioned closer to an edge of the flat-plate-shaped housing than the first solder balls.

8. The socket of claim 7, wherein the first solder balls are position in a central portion of the flat-plate-shape housing.

9. The socket of claim 3, wherein the flat-plate-shaped housing has a plurality of through-holes extending through the flat-plate shaped housing, an inner wall surface of each of the through-holes is a conductive metal.

10. The socket of claim 9, wherein the contacts each have a press-fit portion inserted into one of the through-holes and electrically connected to the inner wall surface of the through-hole.

11. The socket of claim 10, wherein each of the contacts protrudes beyond an upper surface of the flat-plate-shaped housing opposite the lower surface.

12. The socket of claim 10, wherein the first solder balls are electrically connected to the inner walls surfaces of the through-holes.

13. The socket of claim 3, wherein the frame defines, in an in- plane direction of the flat-plate-shaped housing, the position of an electronic component having a lower surface including a plurality of pads configured to contact the contacts upon the electronic component being mounted.

14. The socket of claim 13, further comprising a first spring element disposed on a first side of the frame and a second spring element disposed on a second side of the frame, the second side does not face the first side.

15. The socket of claim 14, wherein the first spring element pushes the electronic component toward a third side of the frame facing the first side and the second spring element pushes the electronic component toward a fourth side facing the second side.

16. The socket of claim 15, further comprising a plurality of receiving portions on the fourth side, the receiving portions inwardly bulge toward the second side.

17. The socket of claim 13, further comprising a plurality of sitting elements disposed in a plurality of insertion holes of the flat-plate-shaped housing.

18. The socket of claim 17, wherein the sitting elements abut the lower surface of the electronic component and regulate a spacing between the electronic element and an upper surface of the flat-plate-shaped housing.

19. A socket, comprising:
a flat-plate-shaped housing;
a plurality of contacts supported by the flat-plate-shaped housing;
a plurality of first solder balls disposed on a lower surface of the flat-plate-shaped housing and electrically connected to the contacts;
a plurality of second solder balls disposed on the lower surface and not electrically connected to the contacts;
a frame attached to the flat-plate-shaped housing and extending along the flat-plate-shaped housing;
a first spring element disposed on a first side of the frame; and
a second spring element disposed on a second side of the frame, the second side does not face the first side.

20. The socket of claim 19, wherein the first spring element pushes an electronic component toward a third side of the frame facing the first side and the second spring element pushes the electronic component toward a fourth side facing the second side.

21. The socket of claim 20, further comprising a plurality of receiving portions on the fourth side, the receiving portions inwardly bulge toward the second side.

22. A socket, comprising:
a flat-plate-shaped housing;
a plurality of contacts supported by the flat-plate-shaped housing;

a plurality of first solder balls disposed on a lower surface of the flat-plate-shaped housing and electrically connected to the contacts;

a plurality of second solder balls disposed on the lower surface and not electrically connected to the contacts; and a plurality of sitting elements disposed in a plurality of insertion holes of the flat-plate-shaped housing.

23. The socket of claim 22, wherein the sitting elements abut a lower surface of an electronic component and regulate a spacing between the electronic component and an upper surface of the flat-plate-shaped housing.

* * * * *